United States Patent
Pawlik et al.

(10) Patent No.: US 10,661,541 B2
(45) Date of Patent: May 26, 2020

(54) BACKING FILM FOR PHOTOVOLTAIC MODULE WITH IMPROVED PIGMENT DISPERSION

(71) Applicants: Andreas Pawlik, Recklinghausen (DE); Martin Wielpuetz, Senden (DE); Michael Beyer, Raesfeld (DE)

(72) Inventors: Andreas Pawlik, Recklinghausen (DE); Martin Wielpuetz, Senden (DE); Michael Beyer, Raesfeld (DE)

(73) Assignee: Evonik Operations GmbH, Essen (DE)

(*) Notice: Subject to any disclaimer, the term of this patent is extended or adjusted under 35 U.S.C. 154(b) by 1160 days.

(21) Appl. No.: 13/649,498

(22) Filed: Oct. 11, 2012

(65) Prior Publication Data

US 2013/0092227 A1    Apr. 18, 2013

(30) Foreign Application Priority Data

Oct. 14, 2011 (DE) .................. 10 2011 084 520

(51) Int. Cl.
| | | |
|---|---|---|
| H01L 31/049 | (2014.01) | |
| B32B 27/30 | (2006.01) | |
| B32B 27/20 | (2006.01) | |
| B32B 27/34 | (2006.01) | |
| H01L 31/048 | (2014.01) | |
| B32B 27/08 | (2006.01) | |
| B32B 27/32 | (2006.01) | |
| B32B 37/15 | (2006.01) | |

(52) U.S. Cl.
CPC ............ *B32B 27/302* (2013.01); *B32B 27/08* (2013.01); *B32B 27/20* (2013.01); *B32B 27/32* (2013.01); *B32B 27/34* (2013.01); *H01L 31/0481* (2013.01); *B32B 37/153* (2013.01); *B32B 2250/03* (2013.01); *B32B 2250/24* (2013.01); *B32B 2250/40* (2013.01); *B32B 2264/102* (2013.01); *B32B 2270/00* (2013.01); *B32B 2274/00* (2013.01); *B32B 2307/206* (2013.01); *B32B 2307/416* (2013.01); *B32B 2307/702* (2013.01); *B32B 2307/704* (2013.01); *B32B 2307/71* (2013.01); *B32B 2307/712* (2013.01); *B32B 2457/12* (2013.01); *Y02E 10/50* (2013.01); *Y10T 428/24967* (2015.01); *Y10T 428/31728* (2015.04)

(58) Field of Classification Search
CPC .. H01L 31/048; H01L 31/0481; H01L 31/049
See application file for complete search history.

(56) References Cited

U.S. PATENT DOCUMENTS

| | | | |
|---|---|---|---|
| 4,883,836 A * | 11/1989 | Thill ................................ | 525/66 |
| 5,399,663 A * | 3/1995 | Clark, II ........................ | 528/340 |
| 6,794,048 B2 | 9/2004 | Schmitz et al. | |
| 7,175,896 B2 | 2/2007 | Schmitz et al. | |
| 8,048,504 B2 | 11/2011 | Schmitz et al. | |
| 8,133,561 B2 | 3/2012 | Schmitz et al. | |
| 2002/0119272 A1* | 8/2002 | Ries et al. ................. | 428/36.91 |
| 2004/0023049 A1* | 2/2004 | Fujita et al. ................ | 428/474.7 |
| 2007/0104971 A1 | 5/2007 | Wursche et al. | |
| 2007/0166560 A1 | 7/2007 | Wursche et al. | |
| 2008/0017241 A1* | 1/2008 | Anderson et al. ............ | 136/251 |
| 2008/0166529 A1 | 7/2008 | Hager et al. | |
| 2008/0213552 A1 | 9/2008 | Hager et al. | |
| 2008/0261010 A1 | 10/2008 | Wursche et al. | |
| 2009/0286096 A1 | 11/2009 | Alting et al. | |
| 2010/0003524 A1 | 1/2010 | Luetzeler et al. | |
| 2010/0003534 A1 | 1/2010 | Luetzeler et al. | |
| 2010/0055425 A1 | 3/2010 | Luetzeler et al. | |
| 2010/0065109 A1* | 3/2010 | Hayes ............... | B32B 17/10018 136/251 |
| 2010/0119841 A1 | 5/2010 | Muckenhuber | |
| 2010/0221551 A1 | 9/2010 | Wursche et al. | |
| 2010/0288342 A1* | 11/2010 | Wu .............................. | 136/252 |
| 2010/0288353 A1* | 11/2010 | Kliesch et al. ............... | 136/256 |

(Continued)

FOREIGN PATENT DOCUMENTS

| | | |
|---|---|---|
| CA | 2782097 A1 | 6/2011 |
| DE | 10 2008 044 225 A1 | 6/2010 |

(Continued)

OTHER PUBLICATIONS

U.S. Appl. No. 10/589,264, filed Aug. 14, 2006, US2007/0166560 A1, Wursche, et al.
U.S. Appl. No. 12/780,595, filed May 14, 2010, US2010/0221551 A1, Wursche, et al.
U.S. Appl. No. 11/816,595, filed Mar. 25, 2008, US2008/0166529 A1, Hager, et al.
U.S. Appl. No. 11/816,588, filed Aug. 17, 2007, US2008/0213552 A1, Hager, et al.
U.S. Appl. No. 11/816,556, filed Jan. 28, 2008, US2008/0261010 A1, Wursche, et al.
U.S. Appl. No. 13/332,470, filed Dec. 21, 2011, US2012/0094116 A1, Wursche, et al.
U.S. Appl. No. 11/586,526, filed Oct. 26, 2006, US2007/0104971 A1, Wursche, et al.

(Continued)

*Primary Examiner* — Bethany L Martin
(74) *Attorney, Agent, or Firm* — Oblon, McClelland, Maier & Neustadt, L.L.P.

(57) ABSTRACT

A multilayered laminate film containing dispersed pigment which is suitable as a back cover for a solar module is provided. The film comprises, in the order listed: a) a layer of a moulding composition which comprises: at least 35% by weight, of polyamide; and from 1 to 65% by weight of a light-reflecting filler; b) optionally, a layer of a thermoplastic moulding composition; and c) a layer of a moulding composition which comprises at least 35% by weight, of polyamide; and from 1 to 65% by weight of a light-reflecting filler; wherein at least one of layers a) and c) further comprises from 1 to 25% by weight of the layer composition of a polyamide elastomer which is a polyetheresteramide, a polyetheramide or a combination thereof. A solar module containing the multilayered laminate film is also provided.

10 Claims, No Drawings

(56) References Cited

U.S. PATENT DOCUMENTS

| | | | |
|---|---|---|---|
| 2011/0045269 A1 | 2/2011 | Wursche et al. | |
| 2011/0165358 A1 | 7/2011 | Dowe et al. | |
| 2012/0048352 A1* | 3/2012 | Nagato | C08G 18/6279 136/251 |
| 2012/0094116 A1 | 4/2012 | Wursche et al. | |

FOREIGN PATENT DOCUMENTS

| | | | |
|---|---|---|---|
| JP | 2003-012407 A | 1/2003 | |
| JP | 2006-037070 A | 2/2006 | |
| JP | 2009-108258 A | 5/2009 | |
| WO | WO 2008/138022 A1 | 11/2008 | |
| WO | WO2010126000 | * 11/2010 | ......... C08G 18/6279 |
| WO | WO 2011/066595 A1 | 6/2011 | |

OTHER PUBLICATIONS

U.S. Appl. No. 12/438,142, filed Feb. 20, 2009, US2010/0003524 A1, Luetzeler, et al.
U.S. Appl. No. 12/438,364, filed Mar. 26, 2009, US2010/0003534 A1, Luetzeler, et al.
U.S. Appl. No. 12/373,547, filed Jan. 13, 2009, US2010/0055425 A1, Luetzeler, et al.
U.S. Appl. No. 12/302,298, filed Nov. 25, 2008, US2009/0286096 A1, Alting, et al.
U.S. Appl. No. 12/989,899, filed Nov. 27, 2010, US2011/0045269 A1, Wursche, et al.
U.S. Appl. No. 13/649,616, filed Oct. 11, 2012, Pawlik, et al.
U.S. Appl. No. 13/649,319, filed Oct. 11, 2012, Pawlik, et al.
U.S. Appl. No. 13/649,379, filed Oct. 11, 2012, Pawlik, et al.
U.S. Appl. No. 13/649,562, filed Oct. 11, 2012, Pawlik, et al.
European Search Report dated Jan. 18, 2013 in European Patent Application No. 12 18 7741.
Notification of Reasons for Refusal dated Sep. 26, 2016 in Japanese Patent Application No. 2012-228277.

* cited by examiner

BACKING FILM FOR PHOTOVOLTAIC MODULE WITH IMPROVED PIGMENT DISPERSION

CROSS REFERENCE TO RELATED APPLICATIONS

This application claims priority to DE 102011084520.8 filed Oct. 14, 2011, the disclosure of which is incorporated herein by reference in its entirety.

BACKGROUND OF THE INVENTION

The invention relates to a multilayer film as a back cover for polyamide-containing solar modules with improved pigment and filler dispersion.

Solar modules, frequently also referred to as photovoltaic modules, serve for electrical power generation from sunlight and consist of a laminate which comprises a solar cell system as the core layer. This core layer is encased with encapsulation materials which serve as protection against mechanical and weathering-related influences.

In conventional solar modules, the active solar cell is positioned between a front cover and a back cover. The front cover is transparent, generally consists of glass; and is bonded by means of an adhesion promoter layer which often contains an ethylene-vinyl acetate copolymer to the layer comprising the solar cell. The back cover provides electric shielding, serves as protection against weathering influences such as UV light and acts as a moisture barrier.

Film composites composed of fluoropolymer films and polyester may conventionally be employed as a back cover. The fluoropolymer film on the outside provides weathering resistance, while the polyester film is utilized to obtain mechanical stability and electrical insulation properties. A further fluoropolymer film on the inside serves for attachment to the sealing layer of the solar cell system. However, such fluoropolymer films have only low adhesion to the sealing layer which is used as embedding material for the solar cells themselves. In addition, the fluoropolymer film contributes to electrical insulation only to a minor degree, which results in the need to use a comparatively thick polyester film.

WO 2008138022 therefore proposes replacing the two fluoropolymer films in such composites with films of nylon-12 (PA12). In a development thereof, WO 2011066595 proposes that the solar cell-facing thermoplastic layer comprise a light-reflecting filler such as titanium dioxide, while the solar cell-remote thermoplastic layer comprise a second filler such as glass fibres, wollastonite or mica, which brings about a higher thermal conductivity of this layer. Illustrative thermoplastics come from the group of the polyamides, polyesters or blends of polyamide and polyolefin. Explicit mention is made of PA11, PA12 and PA1010, and blends thereof with polyolefins.

In such photovoltaic modules, the distribution of the light-reflecting filler is of particular significance. Thus, the reflection level and hence the power yield of the solar cell increase with increasing dispersion. In addition, the quality of distribution simultaneously influences the surface quality of the backing film. This is exceptionally important in the generally purely polyamide-based layer of the back cover, said layer facing the actual solar cell and being visible on the outside, since pigment agglomerates become particularly apparent here due to the low layer thicknesses.

SUMMARY OF THE INVENTION

Therefore, an object of the present invention is to provide a film suitable for a photovoltaic module back cover which has improved pigment and filler dispersion.

A further object of the invention is to provide a photovoltaic module having improved reflectivity and stability of laminate layers.

These and other objects have been achieved by the present invention, the first embodiment of which includes a multilayer film, comprising, in the order listed:
  a) a layer of a moulding composition which comprises:
    at least 35% by weight, based on the overall layer moulding composition, of polyamide; and
    from 1 to 65% by weight of a light-reflecting filler;
  b) optionally, a layer of a thermoplastic moulding composition; and
  c) a layer of a moulding composition which comprises at least 35% by weight, based on the overall moulding composition, of polyamide; and
    from 1 to 65% by weight of a light-reflecting filler; wherein
    at least one of layers a) and c) further comprises from 1 to 25% by weight of the layer composition of a polyamide elastomer which is a polyetheresteramide, a polyetheramide or a combination thereof.

In one embodiment of the present invention the layer a) and the layer c) are in direct succession.

In another embodiment, the film comprises the layer b) and a thickness of the layer b) is from 100 to 500 μm.

In a preferred embodiment, the polyamide elastomer is a polyetheramide and in another preferred embodiment the light-reflecting filler is titanium dioxide.

In one highly preferred embodiment, the present invention provides a photovoltaic module, comprising; a solar cell embedded in a sealing layer; and the multilayer film according to the invention as a back cover; wherein the layer a) of the laminate film is bonded to the sealing layer.

DETAILED DESCRIPTION OF THE INVENTION

The present invention provides a multilayer film, comprising, in the order listed:
  a) a layer of a moulding composition which comprises:
    at least 35% by weight, based on the overall layer moulding composition, of polyamide; and
    from 1 to 65% by weight of a light-reflecting filler;
  b) optionally, a layer of a thermoplastic moulding composition; and
  c) a layer of a moulding composition which comprises at least 35% by weight, based on the overall moulding composition, of polyamide; and
    from 1 to 65% by weight of a light-reflecting filler; wherein
    at least one of layers a) and c) further comprises from 1 to 25% by weight of the layer composition of a polyamide elastomer which is a polyetheresteramide, a polyetheramide or a combination thereof.

In the layer a) the polyamide content is preferably at least 40% by weight, more preferably at least 45% by weight, especially preferably at least 50% by weight and most preferably at least 55% by weight, and the content of the light-reflecting filler is preferably from 2 to 60% by weight, more preferably of 3 to 55% by weight, especially preferably of 4 to 50% by weight and most preferably of 5 to 45% by weight.

In the layer c) the polyamide content is preferably at least 40% by weight, more preferably at least 45% by weight, especially preferably at least 50% by weight and most preferably at least 55% by weight and the content of the filler is preferably of 2 to 60% by weight, more preferably of 3 to 55% by weight, especially preferably of 4 to 50% by weight and most preferably of 5 to 45% by weight, where the percentages are each based on the overall moulding composition.

The film composite is modified by using a polyamide elastomer selected from polyetheresteramide and polyetheramide as the polyamide component in the moulding composition of the layer according to a) and/or in the moulding composition of the layer according to c) such that the moulding composition of the layer according to a) and/or the moulding composition of the layer according to c) contains 1 to 25% by weight, preferably 2 to 20% by weight and more preferably 4 to 20% by weight of polyamide elastomer.

It is additionally preferable for both the layer a) and the layer c) to comprise the polyamide elastomer. In some cases, the layer adhesion between the layers according to a) and b) and/or between the layers according to b) and c) may be improved by insertion of an adhesion promoter.

The polyamide may be a partly crystalline polyamide, for example PA6, PA66, PA610, PA612, PA10, PA810, PA106, PA1010, PA11, PA1011, PA1012, PA1210, PA1212, PA814, PA1014, PA618, PA512, PA613, PA813, PA914, PA1015, PA11, PA12, or a semi aromatic polyamide, called a polyphthalamide (PPA). (The naming of the polyamides corresponds to the international standard, the first number(s) giving the number of carbon atoms of the starting diamine and the last number(s) the number of carbon atoms of the dicarboxylic acid. If only one number is mentioned, this means that the starting material was an α,ω-aminocarboxylic acid or the lactam derived therefrom; for the rest, reference is made to H. Dominighaus, Die Kunststoffe and ihre Eigenschaften [The polymers and their properties], pages 272 ff., VDI-Verlag, 1976.) Suitable PPAs are, for example, PA66/6T, PA6/6T, PA6T/MPMDT (MPMD stands for 2-methylpentamethylenediamine), PA9T, PA10T, PA11T, PA12T, PA14T and copolycondensates of these latter types with an aliphatic diamine and an aliphatic dicarboxylic acid or with an ω-aminocarboxylic acid or a lactam. Partly crystalline polyamides have an enthalpy of fusion of more than 25 J/g, measured by the DSC method to ISO 11357 in the 2nd heating step and integration of the melt peak.

The polyamide may also be a semicrystalline polyamide. Semicrystalline polyamides have an enthalpy of fusion of 4 to 25 J/g, measured by the DSC method to ISO 11357 in the 2nd heating step and integration of the melt peak. Examples of suitable semicrystalline polyamides are The polyamide of 1,10-decanedioic acid or 1,12-dodecanedioic acid and 4,4'-diaminodicyclohexylmethane (PA PACM10 and PA PACM12), proceeding from a 4,4'-diaminodicyclohexylmethane with a trans,trans isomer content of 35 to 65%;

copolymers based on the abovementioned partly crystalline polyamides; and blends of the abovementioned partly crystalline polyamides and a compatible amorphous polyamide.

The polyamide may also be an amorphous polyamide. Amorphous polyamides have an enthalpy of fusion of less than 4 J/g, measured by the DSC method to ISO 11357 in the 2nd heating step and integration of the melt peak. Examples of amorphous polyamides are:

the polyamide of terephthalic acid and/or isophthalic acid and the isomer mixture of 2,2,4- and 2,4,4-trimethylhexamethylenediamine, the polyamide of isophthalic acid and 1,6-hexamethylenediamine, the copolyamide of a mixture of terephthalic acid/isophthalic acid and 1,6-hexamethylenediamine, optionally in a mixture with 4,4'-diaminodicyclohexylmethane, the copolyamide of terephthalic acid and/or isophthalic acid, 3,3'-dimethyl-4,4'-diaminodicyclohexylmethane and laurolactam or caprolactam, the (co)polyamide of 1,12-dodecanedioic acid or sebacic acid, 3,3'-dimethyl-4,4'-diaminodicyclohexylmethane, and optionally laurolactam or caprolactam, the copolyamide of isophthalic acid, 4,4'-diaminodicyclohexylmethane and laurolactam or caprolactam, the polyamide of 1,12-dodecanedioic acid and 4,4'-diaminodicyclohexylmethane (in the case of a low trans, trans isomer content), the (co)polyamide of terephthalic acid and/or isophthalic acid and an alkyl-substituted bis(4-aminocyclohexyl) methane homologue, optionally in a mixture with hexamethylenediamine, the copolyamide of bis(4-amino-3-methyl-5-ethylcyclohexyl)methane, optionally together with a further diamine, and isophthalic acid, optionally together with a further dicarboxylic acid, the copolyamide of a mixture of m-xylylenediamine and a further diamine, e.g. hexamethylenediamine, and isophthalic acid, optionally together with a further dicarboxylic acid, for example terephthalic acid and/or 2,6-naphthalenedicarboxylic acid, the copolyamide of a mixture of bis(4-aminocyclohexyl) methane and bis(4-amino-3-methylcyclohexyl)methane, and aliphatic dicarboxylic acids having 8 to 14 carbon atoms, and polyamides or copolyamides of a mixture comprising 1,14-tetradecanedioic acid and an aromatic, arylaliphatic or cycloaliphatic diamine.

These examples may be varied to a very substantial degree by addition of further components (for example caprolactam, laurolactam or diamine/dicarboxylic acid combinations) or by partial or full replacement of starting components by other components.

Polyetheresteramides are described for example in DE-A-25 23 991 and DE-A-27 12 987; they contain a polyetherdiol as a comonomer. Polyetheramides are described, for example in DE-A-30 06 961; they contain a polyetherdiamine as a comonomer.

In the polyetherdiol or the polyetherdiamine, the polyether unit may be based, for example, on 1,2-ethanediol, 1,2-propanediol, 1,3-propanediol, 1,4-butanediol or 1,3-butanediol. The polyether unit may also have a mixed structure, for instance with random or blockwise distribution of the units which originate from the diols. The weight-average molar mass of the polyetherdiols or polyetherdiamines is 200 to 5000 g/mol and preferably 400 to 3000 g/mol; a proportion thereof in the polyetheresteramide or polyetheramide is preferably 4 to 60% by weight and more preferably 10 to 50% by weight. Suitable polyetherdiamines are obtainable by conversion of the corresponding polyetherdiols by reductive amination or coupling onto acrylonitrile with subsequent hydrogenation. They are commercially available, for example, in the form of the JEFFAMIN® D or ED types, or the ELASTAMINE® types from Huntsman Corp. or in the form of the Polyetheramine D series from BASF SE. It is also possible to use smaller amounts of a polyethertriamine, for example a JEFFAMIN® T type, if a branched polyetheramide is to be used. Preference is given to using polyetherdiamines or polyethertriamines which contain an average of at least 2.3 carbon atoms in the chain per ether oxygen atom. According to the invention, preference may be given to polyetheramides owing to better hydrolysis stability.

The moulding composition of the layer a) may contain either one of the abovementioned polyamides or two or more thereof as a mixture. In addition, up to 40% by weight, based on the overall polymer content of the moulding composition, of other thermoplastics may be present, for example impact-modifying rubbers. Any rubbers present preferably contain, as conventionally known, functional groups with which compatibility with the polyamide matrix may be obtained. In addition, the assistants and additives customary for polyamides may be present, especially light and/or heat stabilizers. The light-reflecting filler may be any filler having a reflection capacity higher than the reflection capacity of the thermoplastic component of the layer according to a); preferably, the light reflecting filler is titanium dioxide (WO 2011066595).

The moulding composition of the layer according to b), may comprise, as a thermoplastic, for example, polyamide, polyolefin and/or polyester. In addition, customary assistants and additives may be present, especially light and/or heat stabilizers, light-reflecting fillers, for example titanium dioxide, and reinforcing fillers, for example glass fibres, wollastonite or mica.

For the moulding composition of the layer according to c), the same applies as to the moulding composition of the layer according to a), and also, with regard to fillers, the same as for the moulding composition of the layer according to b). In addition, the moulding composition of the layer according to c) may be coloured and/or comprise a matting agent.

In the three-layer embodiment, the individual film layers generally may have the following thicknesses:

layers according to a) and c): 15 to 100 µm and preferably 25 to 50 µm;

layer according to b): 100 to 500 µm and preferably 150 to 400 µm.

In the two-layer embodiment, the layers thicknesses may generally be as follows:

layer according to a): 15 to 100 µm and preferably 25 to 50 µm;

layer according to c): 100 to 500 µm and preferably 150 to 400 µm.

Any adhesion promoter layers present between the layers according to a) and b) and/or the layers according to b) and c) may generally be 3 to 40 µm and preferably 5 to 25 µm thick.

The multilayer film according to the present invention may be produced by all conventionally known methods, for example, coextrusion or lamination.

The invention also provides for the use of the film as a back cover of a photovoltaic module. For this purpose, the layer a) may be bonded, for example by lamination or adhesion, to the sealing layer into which the solar cell has been embedded. Owing to the proportion of polyamide or polyamide elastomer in the layer a), the lamination affords good adhesion to the sealing layer. The sealing layer may be composed of any material conventionally known for such utility.

The invention further provides a photovoltaic module which comprises the multilayer film according to the invention as a back cover, with bonding of the layer a) to the sealing layer into which the solar cell has been embedded.

Having generally described this invention, a further understanding can be obtained by reference to certain specific examples which are provided herein for purposes of illustration only, and are not intended to be limiting unless otherwise specified.

EXAMPLES

The following moulding compositions were produced; "parts" are always parts by weight:

Compound 1 for Outer Layers:

79.25 parts of VESTAMID® L1901 nf (PA12), 0.5 part of IRGANOX® 1098 (a sterically hindered phenolic antioxidant), 0.2 part of TINUVIN® 312 (UV absorber) and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 2 for Outer Layers:

71.75 parts of VESTAMID® L1901 nf, 7.5 parts of a polyetheresteramide (prepared from 63.796% by weight of laurolactam, 6.645% by weight of dodecanedioic acid, 29.492% by weight of PTHF 1000 and 0.067% by weight of 50% hypophosphorous acid), 0.5 part of IRGANOX® 1098, 0.2 part of TINUVIN® 312 and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 3 for Outer Layers:

64.25 parts of VESTAMID® L1901 nf, 15 parts of the same polyetheresteramide as in Compound 2, 0.5 part of IRGANOX® 1098, 0.2 part of TINUVIN® 312 and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 4 for Middle Layer:

50.6 parts of VESTAMID® L1901, 26 parts of MOPLEN HP552L (homopolypropylene, extrusion type), 20 parts of TEC 110 kaolin, 3 parts of KRATON® FG1901 (a maleic anhydride-modified styrene-ethylene/butylene block copolymer) and 0.4 part of IRGANOX® 1098 were mixed with the aid of a twin-screw extruder (Coperion Werner & Pfleiderer ZSK 25 WLE, 36 L/D) at a barrel temperature of 200° C. The extrudate was cooled with the aid of a water bath and chopped; the pellets were subsequently dried in a forced-air oven at 80° C. for 12 hours.

Extrusion of Three-Layer Films:

A multilayer film system from Collin (300 mm slot die, 0-6 mm gap, co-extrusion feed block for 3-layer or 5-layer films) was used to produce three-layer films at a processing temperature of approx. 230° C. The middle layer was set to 250 µm, and each of the outer layers to 50 µm. The results are shown in Table 1.

TABLE 1

| | Examples | |
|---|---|---|
| | Layer structure | Reflectivity at 440 mm [%] |
| Comparative example | Compound 1/Compound 4/Compound 1 | 89.9 |
| Example 1 | Compound 2/Compound 4/Compound 2 | 91.5 |
| Example 2 | Compound 3/Compound 4/Compound 3 | 92.2 |

The improved pigment dispersion is manifested in the improvement in reflectivity in accordance with the invention.

Numerous modifications and variations on the present invention are possible in light of the above description. It is therefore to be understood that within the scope of the appended claims, the invention may be practiced otherwise than as specifically described herein.

The invention claimed is:

1. A multilayer film, comprising, in the order listed:
a) a first outermost surface layer of a moulding composition, comprising:
at least 35% by weight of polyamide; and
from 1 to 65% by weight of a light-reflecting filler, wherein the % by weight is based on the weight of the moulding composition of the first outermost surface layer;
c) the second outermost surface layer opposite to the first outermost surface layer of a moulding composition which comprises at least 35% by weight of polyamide; and
from 1 to 65% by weight of a light-reflecting filler, wherein the % by weight is based on the weight of the moulding composition of the second outermost surface layer; and
wherein
at least one of the first outermost surface layer and second outermost surface layer further comprises from 1 to 25% by weight of the layer composition of a polyamide elastomer which is a polyetheresteramide, a polyetheramide or a combination thereof,
the first outermost surface layer and the second outermost surface layer are in direct succession,
a thickness of the first outermost surface layer is from 15 to 100 μm, and
a thickness of the second outermost surface layer is from 100 to 500 μm.

2. The multilayer film according to claim 1, wherein the polyamide elastomer present in at least one of the first and second outermost surface layers is a polyetheramide.

3. The multilayer film according to claim 1, wherein the light-reflecting filler is titanium dioxide.

4. The multilayer film according to claim 1, wherein the polyamide of each of the first and second outermost surface layers comprises at least one selected from the group consisting of a partly crystalline polyamide having an enthalpy of fusion of more than 25 J/g, a semicrystalline polyamide having an enthalpy of fusion of from 4 to 25 J/g and an amorphous polyamide having an enthalpy of fusion of less than 4 J/g.

5. The multilayer film according to claim 2 wherein the polyetheramide comprises from 4 to 60% by weight of a polyamine obtained from a diol selected from the group consisting of 1,2-ethanediol, 1,2-propanediol, 1,3-propanediol, 1,4-butanediol and 1,3-butanediol.

6. The multilayer film according to claim 1 wherein at least one of the first outermost surface layer and the second outermost surface layer further comprises an impact-modifying rubber which is optionally modified with a polyamide compatible functional group.

7. A photovoltaic module, comprising;
a solar cell embedded in a sealing layer; and
the multilayer film according to claim 1 as a back cover, wherein the first outermost surface layer of the multilayer film is bonded to the sealing layer.

8. The photovoltaic module according to claim 7, wherein the polyamide elastomer is a polyetheramide.

9. The photovoltaic module according to claim 7, wherein the light-reflecting filler is titanium dioxide.

10. The photovoltaic module according to claim 7, wherein at least one of the first outermost surface layer and the second outermost surface layer further comprise an impact-modifying rubber optionally modified with a polyamide compatible functional group.

* * * * *